US005695617A

United States Patent [19]

Graiver et al.

[11] Patent Number: 5,695,617
[45] Date of Patent: Dec. 9, 1997

[54] SILICON NANOPARTICLES

[75] Inventors: Daniel Graiver; Udo C. Pernisz, both of Midland, Mich.; Mohamed Samy Sayed El-Shall, Richmond, Va.

[73] Assignees: Dow Corning Corporation, Midland, Mich.; Virginia Commonwealth University, Richmond, Va.

[21] Appl. No.: 561,771

[22] Filed: Nov. 22, 1995

[51] Int. Cl.$^6$ .............................. C01B 25/00; C01B 33/00; C01B 33/02
[52] U.S. Cl. .............................. 204/157.41; 204/157.45; 423/324; 423/348
[58] Field of Search .............................. 204/157.41, 157.45; 423/324, 348; 428/402, 688

[56] References Cited

U.S. PATENT DOCUMENTS 5,593,742  1/1997  Lux et al. .............................. 427/586

OTHER PUBLICATIONS

Marine et al., "Picosecond YAG Laser Photoblation of Amorphous Silicon", Appl. Surf. Sci., vol. 46, Nos. 1–4, pp. 239–244, 1990.

The Journal of Chemical Physics, vol. 52, No. 9, May 1, 1970, pp. 4733–4748.

The Journal of Physical Chemistry, vol. 98, No. 12, Mar. 24, 1994, pp. 3067–3070.

Science, vol. 262, 1242–1244, Nov. 19, 1993.

Solid State Communications, vol. 49, No. 8, 809–812, 1984.
* month unavailable.

J. Appl. Physics, 68(10), 5300–5308, Nov. 15, 1990.

*Primary Examiner*—Kathryn L. Gorgos
*Assistant Examiner*—Edna Wong
*Attorney, Agent, or Firm*—James L. Decesare

[57] ABSTRACT

A web-like nanoparticle silicon is produced by laser vaporization of silicon metal in an oxygen-free atmosphere in a diffusion cloud chamber where it aggregates into novel web-like microstructures. The aggregates are porous, and bright yellow to orange photoluminescence from the web-like nanoparticle silicon is observed upon irradiation with ultraviolet light.

5 Claims, 8 Drawing Sheets

SILICON NANOPARTICLES

CROSS-REFERENCE TO RELATED APPLICATIONS

We describe "Silica Nanoparticles" in our prior copending application U.S. Ser. No. 08/398,268, filed Mar. 3, 1995 now U.S. Pat No. 5,580,655. Our present application, however, concerns nanoparticle silicon and not nanoparticle silica.

BACKGROUND OF THE INVENTION

This invention is directed to silicon nanoparticles agglomerated into a three-dimensional web-like structure. The silicon is obtained by laser ablation of a silicon metal target in an oxygen-free atmosphere. The morphology consists of agglomerated nanoparticles about 10 to 20 nanometers (nm) in diameter. The nanoparticles are fused together into an open three-dimensional network which has a high surface area.

The synthesis and characterization of nanoparticles has received attention in recent years for their use as catalysts. A range of nanoparticles has been produced by chemical and physical methods. The most common physical methods involve gas condensation techniques where oven sources are used to produce metal vapors. In spite of success with these methods, there are still problems and limitations, such as (i) reactions between metal vapors and oven materials, (ii) inhomogeneous heating of the source which limits control of particle size and distribution, (iii) incomplete vaporization of refractory metals due to low vapor pressure, (iv) limited control of aggregation, and (v) range of control of composition of the mixed metal particles due to differences in composition between the alloys and mixed vapors.

The advantages over other heating methods which laser vaporization techniques provide are (i) the production of high density metal vapor within a short time, i.e. $10^{-8}$ s, (ii) the generation of directional high speed metal vapor from a solid target for directional deposition of the particles, (iii) control of evaporation from specific spots on a target, and (iv) simultaneous or sequential evaporation of several different targets. Some of these advantages have been demonstrated in the synthesis of ultra-fine metal particles, but control of the nucleation process which strongly affects particle size, composition, and morphology of the deposited material, has not yet been achieved.

According to our invention, we discovered a new form of silicon in which nanoparticles of silicon aggregate into a unique web-like microstructure. This web-like nanoparticle silicon exhibits yellow to orange photoluminescence upon irradiation with blue or ultraviolet light. The web-like nanoparticle silicon has a controllable size and composition, and is synthesized by a technique combining advantages of pulsed laser vaporization and controlled condensation in a diffusion cloud chamber, under well defined conditions of temperature and pressure.

The forms of nanoparticle silicon according to our invention are useful in the semiconductor industry as replacements for etched silicon.

BRIEF SUMMARY OF THE INVENTION

Our invention relates to nanoparticles of silicon prepared by ablation of a silicon metal target with a YAG—Nd laser to form a novel three-dimensional web-like structure. Surprisingly, we discovered that these silicon nanoparticles emit light in the visible spectrum when excited by ultraviolet (UV) or blue light.

Characterization of these nanoparticles by Raman Spectroscopy, Fourier Transform Infrared Spectroscopy (FTIR), UV, X-Ray Diffraction (XRD), and Scanning Electron Micrograph (SEM), indicate their composition to be silicon. They are stable in air to about 600° C. (1100° F.), and are suitable for luminescence in applications where etched silicon is used. Our silicon nanoparticles, however, have the advantage of avoiding the need for an acid etch, which is an undesirable procedure in semiconductor manufacture.

More particularly, our invention relates to nanoparticle silicon exhibiting yellow to orange photoluminescence upon irradiation with ultraviolet (UV) light, and which generally is in the form of a three-dimensional web-like microstructure. The primary nanoparticles have a particle diameter of between about 10 to 20 nanometers, and can be characterized by a photoluminescence spectrum exhibiting a peak at about 600 to 640 nm when the microstructure is irradiated with 230 nm ultraviolet light.

These and other features of our invention will be apparent from consideration of the following description.

BRIEF DESCRIPTION OF THE DRAWINGS

FIG. 2, in particular, is a Scanning Electron Micrograph (SEM) obtained for silicon nanoparticles synthesized according to our invention. The synthesis employed only helium at a total pressure of 800 torr, and temperatures of the upper cold plate and the lower plate were −100° C. and 20° C., respectively.

FIG. 2 is at a magnification of 5,000, and shows a unique agglomerate pattern of particles which appears as a web-like matrix. The web-like array in FIG. 2 has spacing between strands (branches) of less than about one micron. The porous arrangement of aggregates and corresponding inter-chain spacing reveals a superstructure pattern of alternating areas of particles and holes.

FIG. 3 is a high resolution SEM image of the silicon particles shown in FIG. 2 at a magnification of 50,000. Transmission electron microscopy (TEM) reveals a fine dispersion and a high degree of homogeneity of particle size and shape. Individual particle sizes are between 10 to 20 nm, suggesting a range of several hundred to a few thousand molecules per particle. This pattern is very different from other nanoparticles synthesized by conventional oven or sputtering techniques. We believe that the appearance of a web-like morphology is due to the mode of formation and aggregation in the chamber.

FIG. 6 was obtained after annealing the sample for ten minutes. FIG. 7 was obtained after annealing the sample for two hours.

DETAILED DESCRIPTION

According to our invention, new photoluminescent web-like nanoparticle silicon is obtained and prepared by combining laser vaporization of a metal with a controlled condensation from the vapor phase in a modified upward thermal diffusion cloud chamber. In this procedure, a silicon metal vapor is generated in the chamber by pulsed laser vaporization of a silicon metal target in an oxygen-free inert carrier gas. Silicon nanoparticles form on the cold plate of the vacuum chamber shown in FIG. 1.

The web-like nanoparticle silicon is made by placing silicon metal in the lower portion of the vacuum chamber, and subjecting it to the beam of a pulsed laser. The carrier gas is inert and oxygen-free. Silicon metal vapor is generated in the chamber as a result of the pulsed laser vaporization. The silicon metal vapor forms clusters in the vapor phase in the vacuum chamber. The vapor phase silicon metal molecules and clusters are cooled by the carrier gas, and then form silicon nanoparticles, which are in turn condensed in the upper portion of the vacuum chamber on the cold plate.

The following example illustrates this pulsed laser vaporization procedure and our invention in more detail.

EXAMPLE

Figure 2:
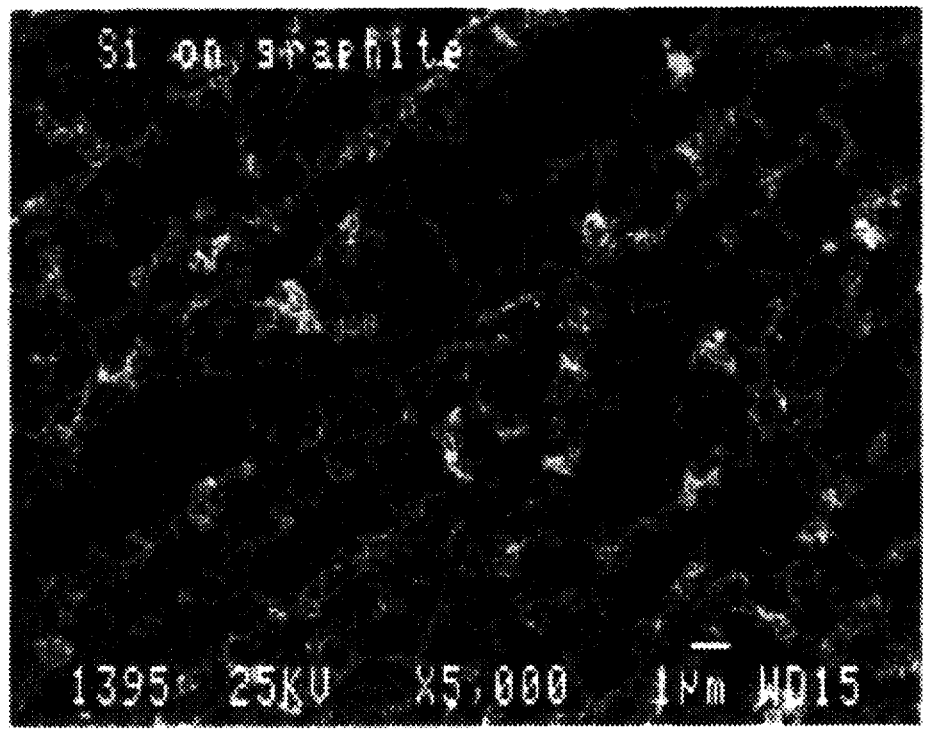
FIGS. 2 and 3 show the morphology of silicon nanoparticles prepared by laser ablation in helium at different magnifications. No oxygen was present in the chamber during preparation.

An upward thermal diffusion cloud chamber was used for synthesis of our nanoscale silicon particles. The general principles of operation, design, and construction of such chambers are described in detail in *THE JOURNAL OF CHEMICAL PHYSICS*, Volume 52, Number 9, May 1, 1970, Pages 4733-4748, which is incorporated herein by reference. In the *JOURNAL* on Page 4737, a cross-sectional view of a typical diffusion cloud chamber is shown in FIG. 2.

Figure 1:
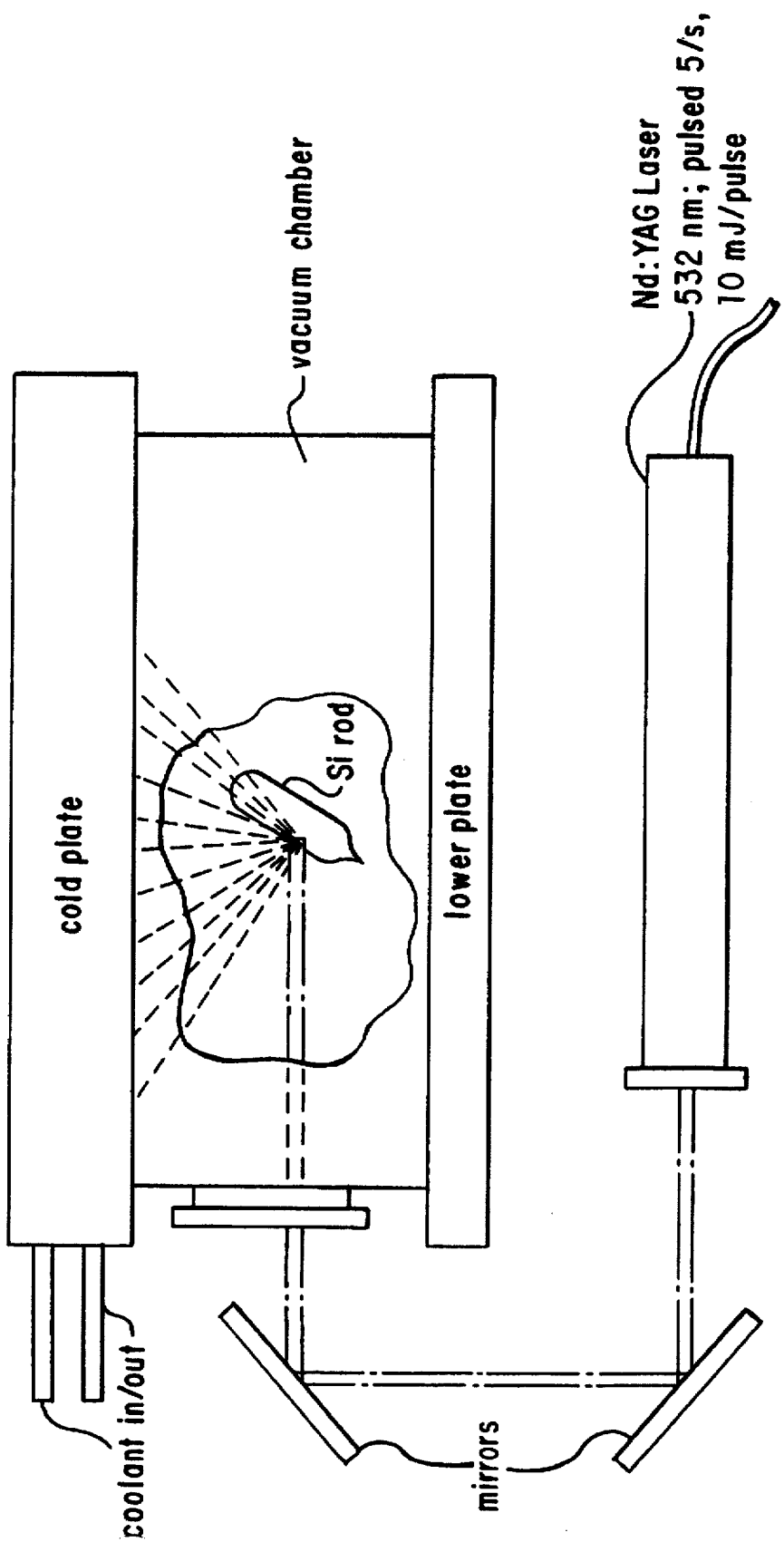
FIG. 1 is a simplified functional representation of an upward thermal diffusion cloud chamber used in the synthesis of silicon nanoparticles according to our invention.

However, we modified our particular chamber, to accommodate synthesis of silicon nanoparticles. Our modified device is shown in FIG. 1. It can be seen to consist of two horizontal circular stainless steel plates separated by a circular glass ring forming a vacuum chamber. A silicon metal rod is the target and is mounted close to the lower plate. The vacuum chamber is filled with an inert carrier gas such as helium or argon. The inert carrier gas contains no oxygen.

The silicon metal rod and the lower plate are maintained at a temperature higher than the temperature of the cold plate. The cold plate is cooled to less than 120 K by circulating liquid nitrogen as coolant through a coolant inlet line and a coolant outlet line. These lines are in the interior of the cold plate, and are used to maintain a desired low temperature for the plate. A temperature gradient between the lower plate and the cold plate provides a steady convection current which can be enhanced by adding helium, argon, krypton, or any other inert gas, under high pressure, i.e. 1×10$^3$ torr. Silicon metal vapor is generated with a pulsed laser using the first harmonic (532 nm) of a yttrium aluminum garnet-neodymium (YAG—Nd) laser (15-30 mJ/pulse, pulse duration 2×10$^{-8}$ s).

Mirrors are used to reflect the beam from the laser to the targeted silicon rod. The laser vaporization releases more than 10$^{14}$ metal atoms per pulse. The silicon metal atoms and clusters form vapor phase silicon metal molecules and clusters. The clusters collide with the inert carrier gas, and this results in cooling by means of collisional energy losses.

Under a total pressure of 800 torr employed in our experiments, the silicon metal and clusters approached the thermal energy of the ambient gas within several hundred microns from the vaporization target. Silicon metal clusters were carried by convection to the nucleation zone near the cold plate of the vacuum chamber where the silicon nanoparticles formed.

Nichrome heater wires were wrapped around the glass ring of the vacuum chamber to provide sufficient heat to prevent condensation on the ring, and to maintain a constant temperature gradient between the lower plate and the cold plate. The particles formed in the nucleation zone and were condensed on the cold plate during laser vaporization (pulse rate 10 Hz) for 1-2 hours. The vacuum chamber was brought to room temperature (20°-25° C.), and particles were collected under atmospheric conditions. No particles were found in the vacuum chamber except on the cold plate.

Glass slides and metal wafers were attached to the cold plate in order to collect material for examination and analysis of the morphology of the deposited silicon nanoparticles. Various analyses were carried out on the silicon nanoparticles including SEM, TEM, FTIR, XRD, UV, and Raman analyses.

In such a vacuum chamber, temperature profile is a linear function of vertical position. Since equilibrium vapor pressure $P_e$ is approximately an exponential function of temperature, silicon vapor is supersaturated in the nucleation zone near the cold plate. Supersaturation can be varied and increased by increasing the temperature gradient between the two plates in the vacuum chamber. Thus, the higher the supersaturation, the smaller the size of the nucleus required for condensation. By controlling the temperature gradient, the total pressure, and the laser power which determines the number and density of the silicon metal atoms released in the vapor phase, the size of the condensing particles can be controlled.

We determined that our nanoparticle silicon is generally in the form of a three-dimensional web-like microstructure. The microstructure has an emission photoluminescence spectrum exhibiting a peak at about 600 to 640 nm. The nanoparticle diameter is between about 5 to 50 nanometers, but preferably is about 10 to 20 nanometers. The nanoparticle silicon forms a three-dimensional web-like microstructure in a porous arrangement of aggregates. The microstructure has an inter-chain spacing and superstructure in the pattern of alternating areas of particles and holes.

Our process depicted in FIG. 1 yields a morphology that possesses several unique properties. Thus, our nanoparticle silicon has a large surface area, unusual adsorptive properties, and is capable of fast diffusivity. However, most surprising is our discovery that these agglomerated nanoparticles emit a relatively intense light in the visible spectrum when excited by a UV source. The wavelength of the emitted light depends on the particular nanoparticle structure, which can be varied, depending on the experimental conditions in which the silicon condenses, i.e. temperature gradient, laser power, laser wavelength, gas pressure, and gas type.

Samples of our silicon nanoparticles appear as a yellow powder. Their novel morphology can be seen by SEM in FIGS. 2 and 3. Thus, a web-like structure with strings of aggregated silicon nanoparticles is apparent in FIG. 2. This web-like morphology is evident from the large number of small pores between silicon strands. The strands are less than one micrometer in size.

Figure 3:
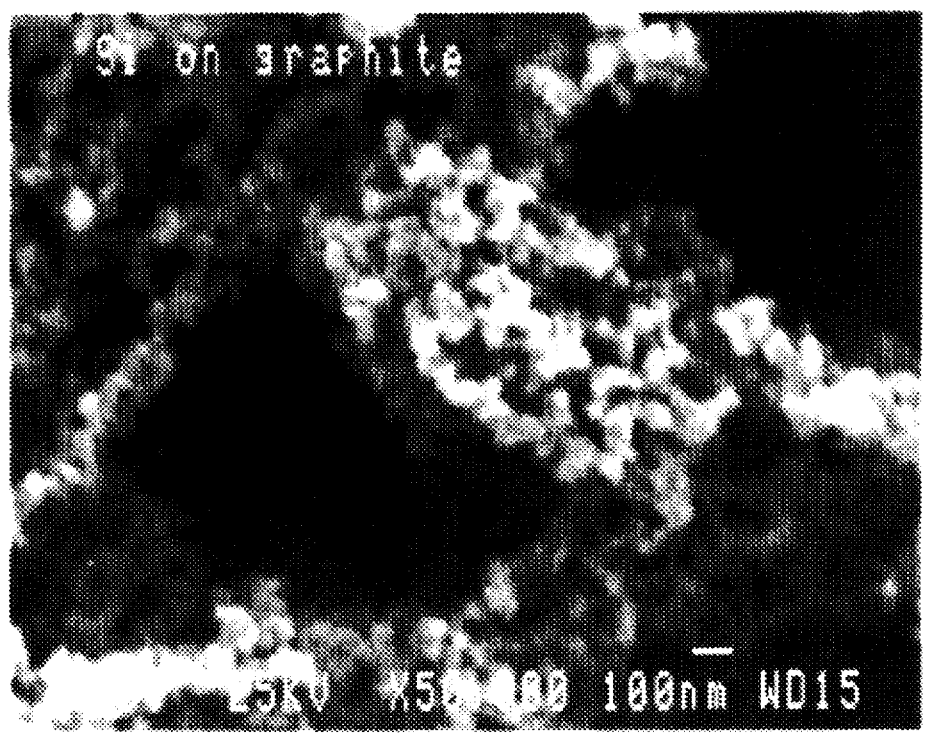

Aggregated silicon particles and their porous structure are visible at higher magnification in FIG. 3. The individual aggregated silicon particles in a strand are shown in FIG. 3. The particle size is uniform and about 10 to 20 nm.

Figure 4:
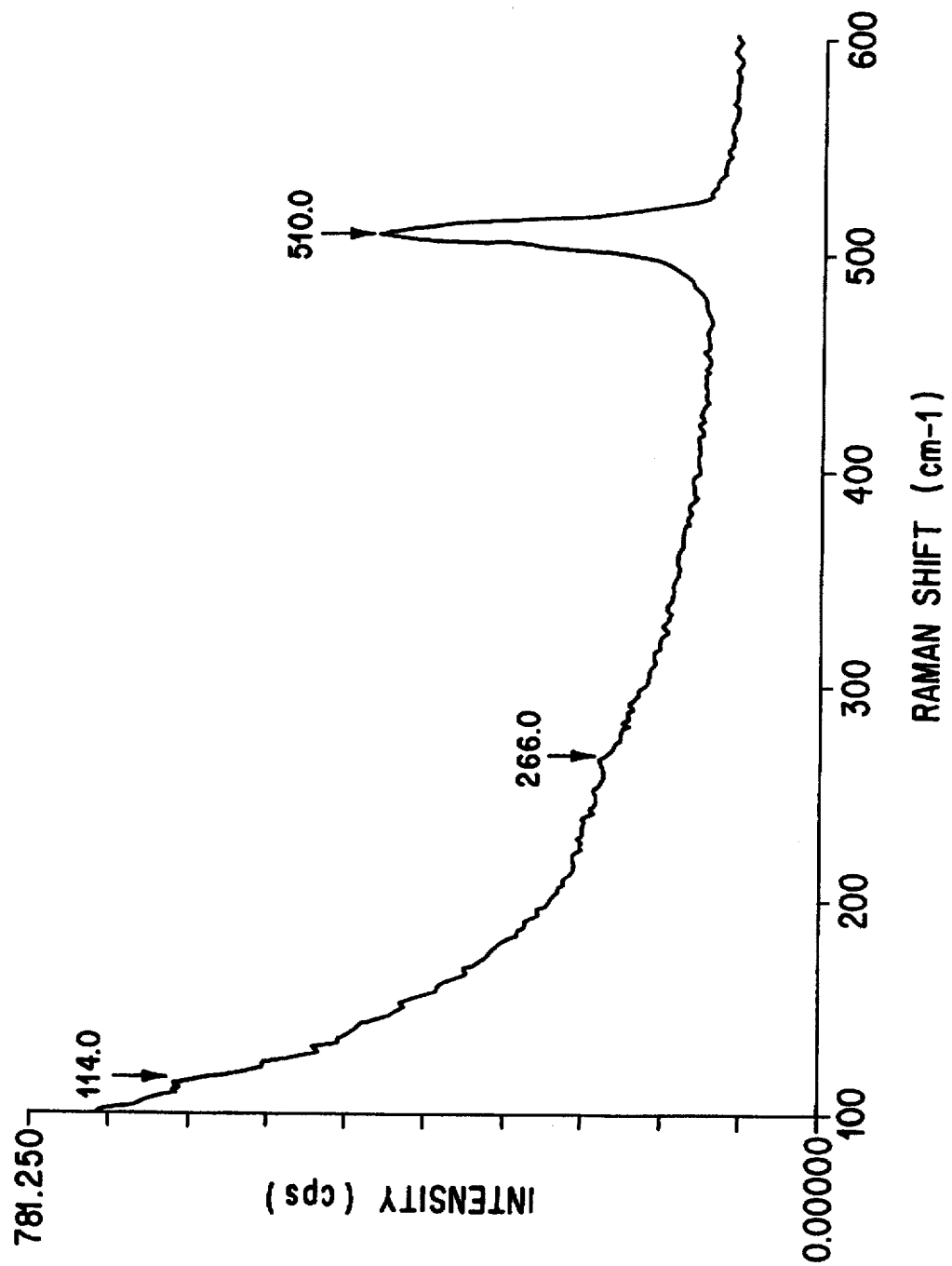
FIG. 4 is a Raman spectrum of our silicon nanoparticles showing the characteristic Si—Si band at 510 $cm^{-1}$.
Figure 5:
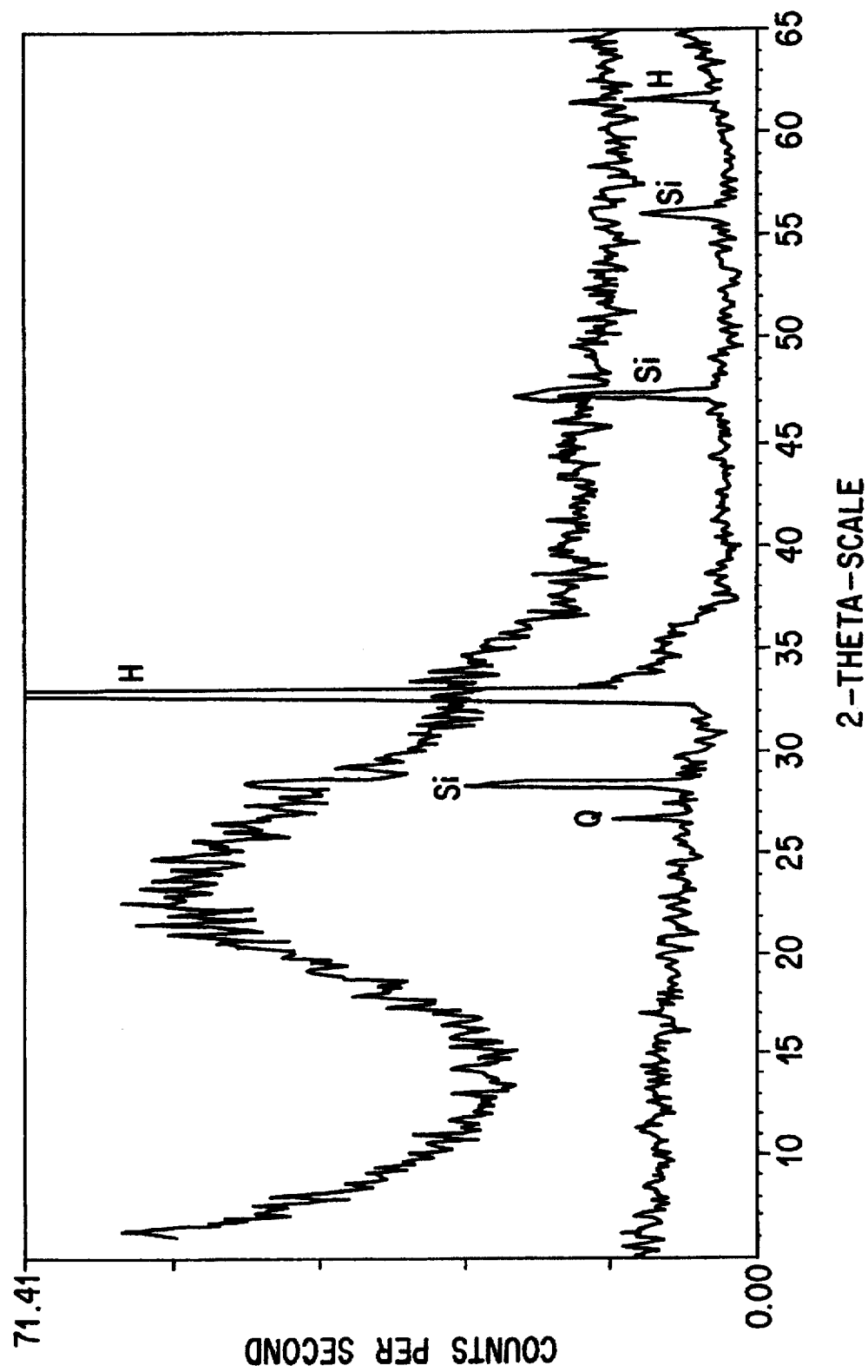
FIG. 5 is a Wide Angle X-Ray Diffraction (WXRD) spectrum of silicon containing particles. The top curve in FIG. 5 is shown for purpose of comparison. It represents a sample prepared in the presence of oxygen, which leads to an amorphous silica composition. The bottom curve in FIG. 5, however, represents our invention, and is a sample prepared in the absence of oxygen, which leads to a crystalline silicon nanoparticle composition.

A Raman spectrum in FIG. 4 shows a dominant peak at about 520 $cm^{-1}$ characteristic of microcrystalline silicon. This was verified in FIG. 5 by Wide Angle X-Ray Diffraction. FIG. 5 conclusively shows crystalline silicon lines at scattering angles of 28°, 47°, and 56°, in the lower spectrum. Such crystalline lines are not present in amorphous silica which is shown for comparison in FIG. 5 in the top line.

Figure 6:
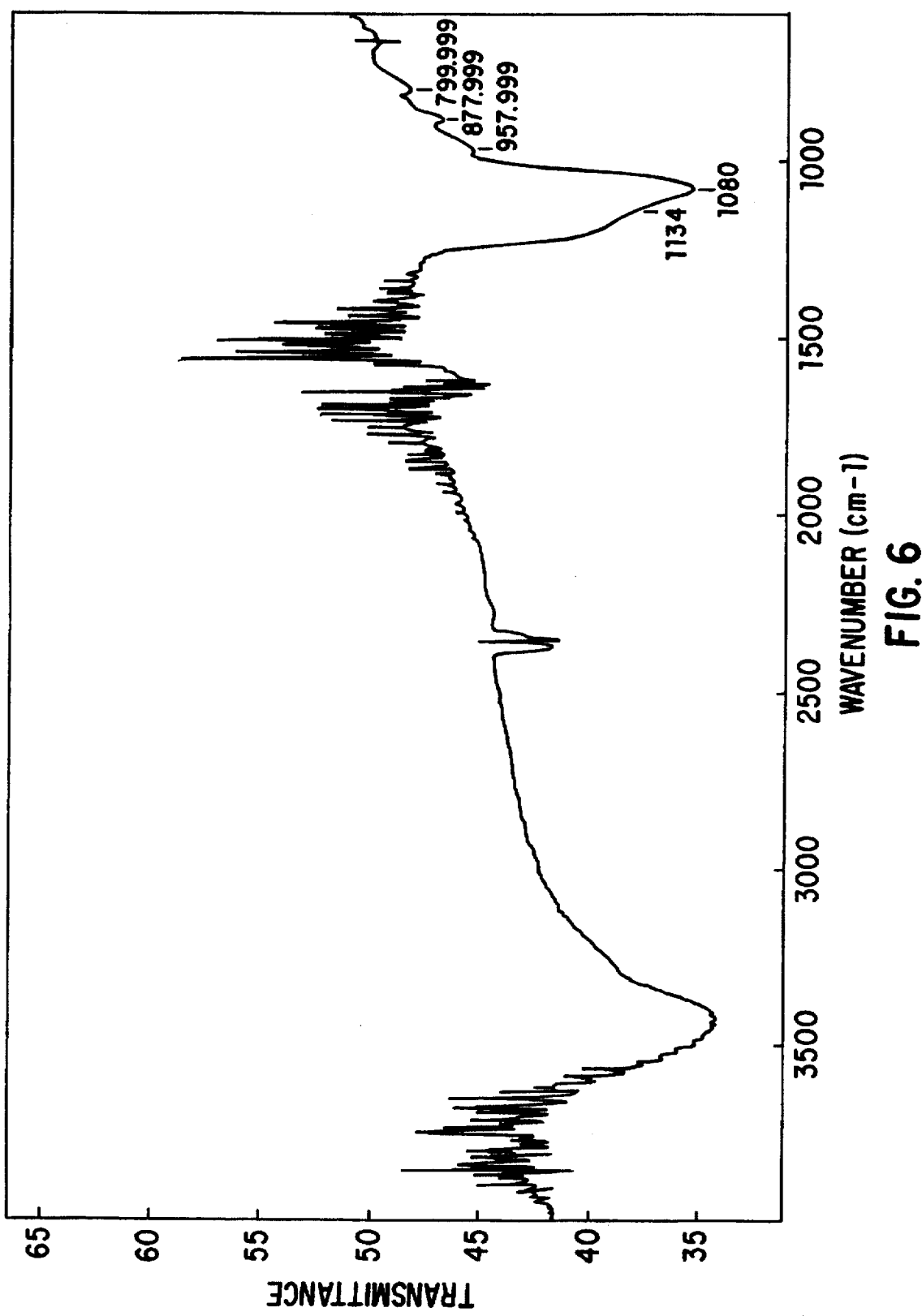
FIGS. 6 and 7 represent the effect of thermal oxidation of our silicon nanoparticles monitored by FTIR. A nanoparticle sample was annealed in a circulating air oven at 290° C.
Figure 7:
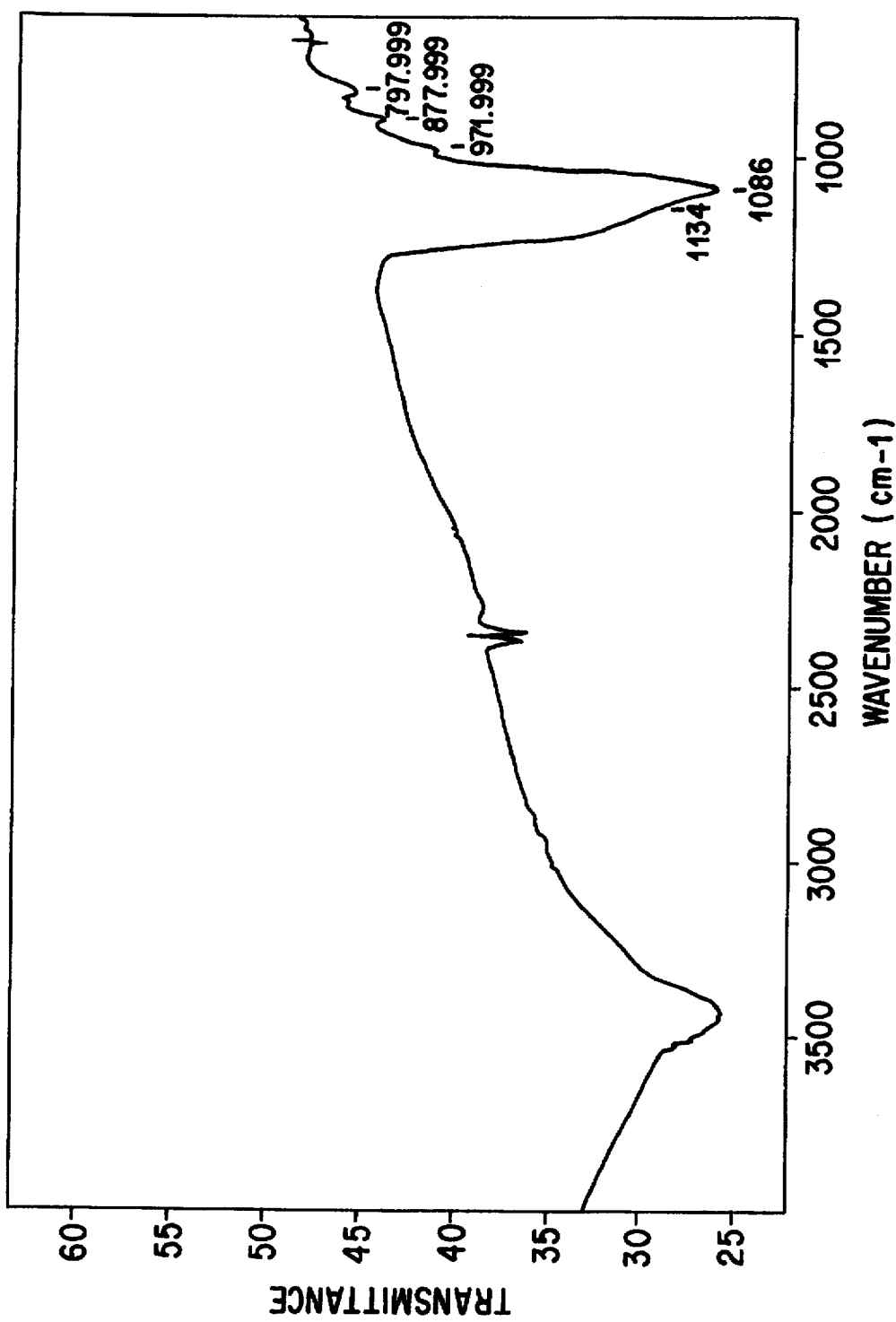

Another noteworthy feature of our invention is the stability of the nanoscale silicon particles in the atmosphere. Thus, in FIGS. 6 and 7, FTIR shows that no significant oxidation takes place upon heating the nanoscale particles at 290° C. for up to two hours. Under these conditions, characteristic silicon peaks at 798 and 878 $cm^{-1}$ were observed. A wide peak at 1080 $cm^{-1}$ characteristic of Si—O—Si stretching vibration is due to a surface oxide layer around the silicon core. However, even after two hours of heating at 290° C., no significant change was observed in the FTIR spectrum as shown in FIG. 7.

Figure 8:
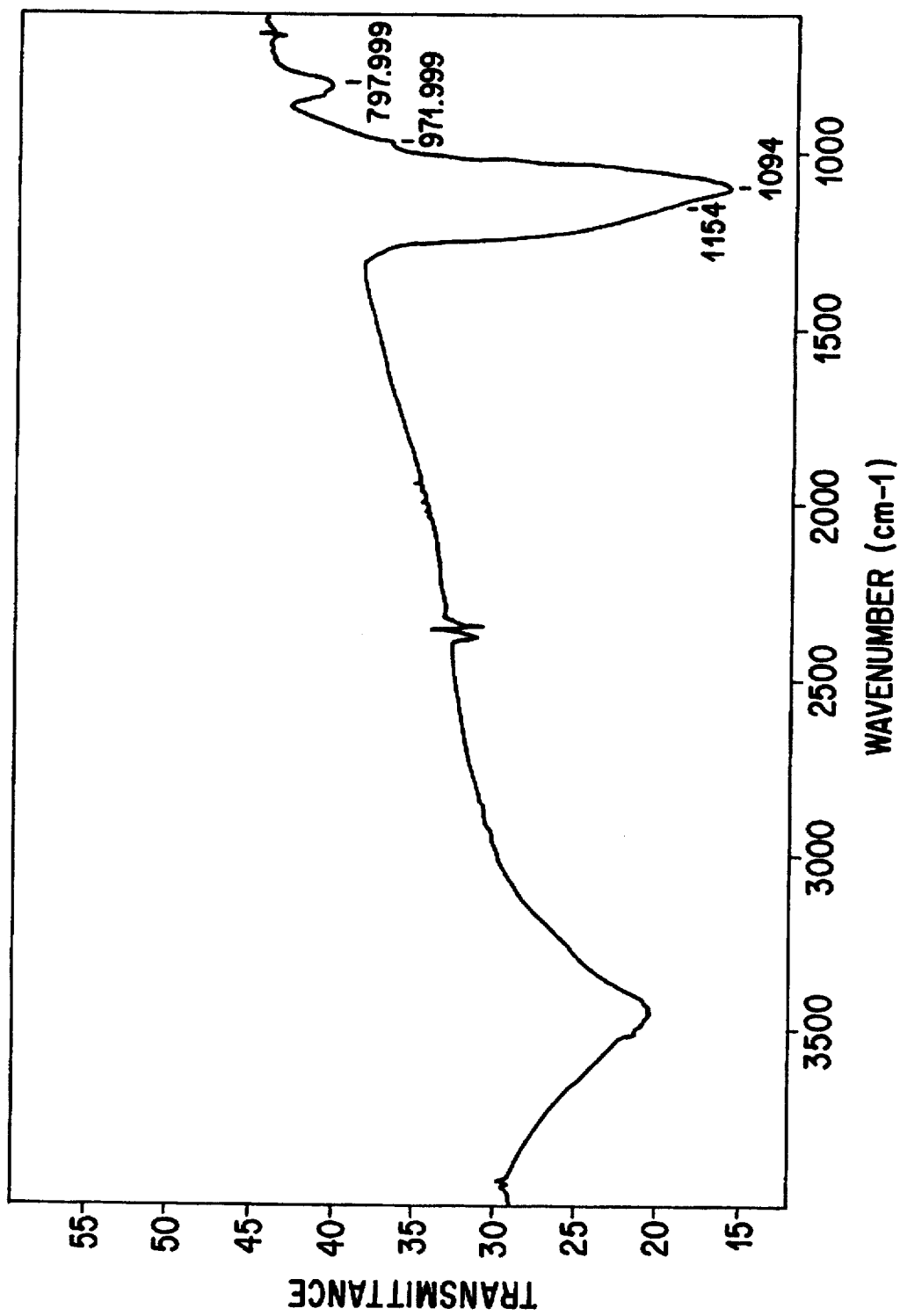
FIG. 8 is similar to FIG. 6, and represents the thermal oxidation of our silicon nanoparticles monitored by FTIR. However, in FIG. 8, the sample was annealed in a circulating air oven at 595° C. for ten minutes.

But upon heating the sample in air at 595° C. for ten minutes, oxidation was visible as shown in FIG. 8. This is indicated by the disappearance of the peak at 878 $cm^{-1}$ and an increase in the peak at 798 $cm^{-1}$. This change however in the FTIR spectrum of silicon, is consistent with its known oxidation at elevated temperatures.

Figure 9:
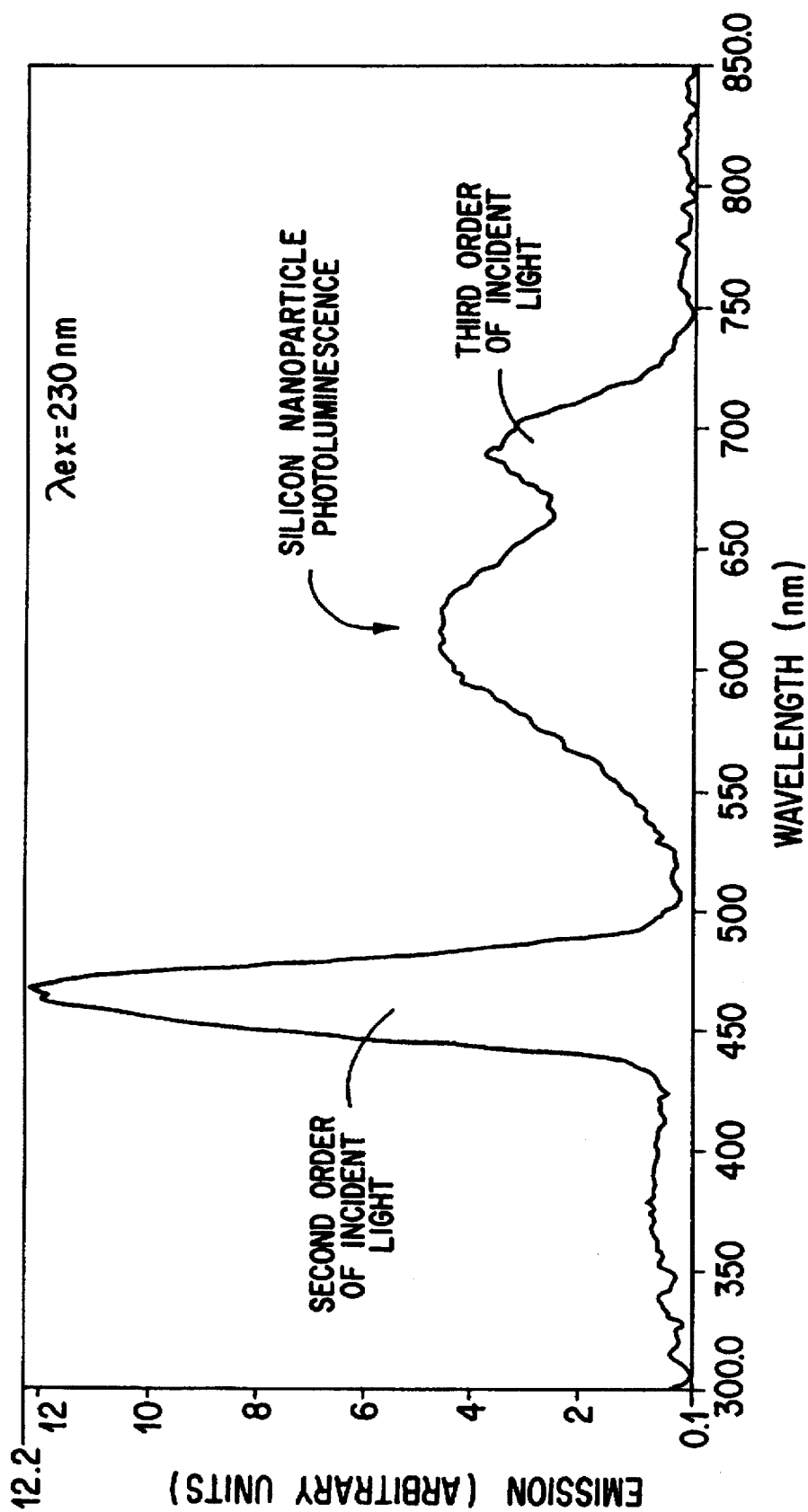
FIG. 9 is a graphical representation of the photoluminescence spectrum of the nanoparticle silicon according to our invention. Photoluminescence from the silicon nanoparticles was the result of irradiation with 230 nm UV light, i.e. lambda$_{excitation}$=230 nm. The emitted spectrum is observed between 600 and 640 nm. The band to the left and the band to the right of the emitted photoluminescence band are the first and second harmonics of the incident irradiation.

Luminescence from our silicon nanoparticles was observed when a sample was irradiated with 230 nm UV light. The emitted photoluminescence spectrum in FIG. 9 displays a maximum emission at about 600 to 640 nm.

Furthermore, the process for the manufacture of photoluminescing devices by our laser ablation method is much simpler, as it does not require etching, or use of strong acids which necessitate special care in waste disposal, and potential contamination of silicon-based devices.

Another surprising feature of our invention is that bright orange chemiluminescence was observed upon irradiation of the nanoparticles of silicon with the YAG—Nd laser (532 nm). This was accompanied by a photoacoustic effect and color change. Thus, we noted appearance of a bright orange flash of light upon irradiating the silicon nanoparticles with the laser. This bright chemiluminescence was accompanied by a mild sound, and caused the yellow silicon nanoparticles to turn white.

These changes, due to chemiluminescence from the silicon nanoparticles after irradiation with the YAG—Nd laser, were observed by FTIR. One spectrum was taken before irradiation, and another spectrum taken immediately after irradiation. The FTIR spectra indicated that the source of chemiluminescence was related to oxidation of the silicon nanoparticles in air upon irradiation with the laser. We believe that the incident laser light was sufficient to break a thin oxide layer around the silicon core, and induced immediate oxidation in air, which leads to this chemiluminescent effect.

The chemiluminescent phenomenon exhibited by our silicon nanoparticles has practical application, for example, in those situations where a short burst of laser power is employed. Thus, our silicon nanoparticles could be used as a coating on a sensor in order to display the exact position a laser beam impacted the surface. In addition, they could be used for calibration and detection of laser beams in general.

Other variations may be made in compositions and methods described above without departing from the essential features of our invention. The forms of our invention are only exemplary and not limitations on its scope defined in the claims.

We claim:

1. A method of making a porous material of fused silicon nanoparticles comprising subjecting silicon metal in a lower portion of a chamber to a pulsed laser in contact with an oxygen-free inert carrier gas, generating silicon metal vapor in the chamber as a result of the pulsed laser, allowing silicon metal atoms present in the silicon metal vapor in the chamber to form vapor phase silicon metal clusters in the chamber, cooling the vapor phase silicon clusters with the carrier gas, and condensing silicon nanoparticles in an upper portion of the chamber on a cold plate cooled to less than 120 K wherein said condensed silicon nanoparticles have a diameter between about 5 to 50 nanometers.

2. The method according to claim 1 in which the oxygen-free inert carrier gas is helium, argon, or krypton.

3. The method according to claim 1 including the additional step of establishing and maintaining a temperature gradient in the chamber between the upper and lower portions thereof.

4. The method according to claim 3 in which the temperature in the lower portion of the chamber is higher than in the upper portion of the chamber.

5. The method according to claim 1 in which vaporization by the pulsed laser is provided by using the first harmonic of a yttrium aluminum garnet-neodymium laser at 532 nm with 15–30 mJ/pulse.

* * * * *